(12) United States Patent
Yew et al.

(10) Patent No.: US 10,079,277 B2
(45) Date of Patent: Sep. 18, 2018

(54) METHOD OF FABRICATING METAL-INSULATOR-METAL CAPACITOR

(71) Applicant: UNITED MICROELECTRONICS CORP., Hsin-Chu (TW)

(72) Inventors: Tri-Rung Yew, Hsinchu (TW); Hung-Chan Lin, Tainan (TW); Li-Wei Feng, Kaohsiung (TW); Chien-Ting Ho, Taichung (TW); Chia-Lung Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 3 days.

(21) Appl. No.: 15/362,771

(22) Filed: Nov. 28, 2016

(65) Prior Publication Data
US 2018/0151666 A1    May 31, 2018

(51) Int. Cl.
*H01L 21/20* (2006.01)
*H01L 49/02* (2006.01)
*H01L 21/311* (2006.01)
*H01L 21/3205* (2006.01)
*H01L 27/108* (2006.01)

(52) U.S. Cl.
CPC ........ *H01L 28/82* (2013.01); *H01L 21/31111* (2013.01); *H01L 21/32051* (2013.01); *H01L 27/10852* (2013.01)

(58) Field of Classification Search
CPC ............... H01L 28/82; H01L 27/10852; H01L 21/31111; H01L 21/32051; H01L 27/10855; H01L 27/10861; H01L 27/10867; H01L 27/1087
See application file for complete search history.

(56) References Cited

U.S. PATENT DOCUMENTS

| | | |
|---|---|---|
| 5,478,769 A | 12/1995 | Lim |
| 6,015,735 A | 1/2000 | Shue |
| 6,215,646 B1 * | 4/2001 | Ochiai .............. H01L 27/10852 257/301 |
| 6,548,853 B1 | 4/2003 | Hwang |
| 7,915,736 B2 | 3/2011 | Kirby |
| 8,049,327 B2 | 11/2011 | Kuo |
| 2001/0023956 A1 * | 9/2001 | Collins .............. H01L 27/1087 257/301 |
| 2005/0104111 A1 | 5/2005 | Srividya |
| 2006/0281246 A1 | 12/2006 | Tegen |
| 2012/0129278 A1 * | 5/2012 | Yoshii .................. B81C 1/00087 438/14 |
| 2014/0104745 A1 * | 4/2014 | Zheng ...................... H01G 4/33 361/275.1 |
| 2014/0126015 A1 | 5/2014 | Kaneko |
| 2014/0126105 A1 | 5/2014 | Kuo |

* cited by examiner

*Primary Examiner* — Thanh Y Tran
(74) *Attorney, Agent, or Firm* — Winston Hsu (57) ABSTRACT

A method of fabricating a metal-insulator-metal capacitor includes providing a dielectric layer. The dielectric layer is etched to form a first hole including a first convex profile bulging into the dielectric layer. Subsequently, the dielectric layer is etched to form a second hole including a second convex profile bulging into the dielectric layer. A first metal layer is formed to conformally cover the capacitor trench. An insulating layer is formed to cover the first metal layer. Finally, a second metal layer is formed covering the insulating layer.

12 Claims, 7 Drawing Sheets

METHOD OF FABRICATING METAL-INSULATOR-METAL CAPACITOR

BACKGROUND OF THE INVENTION

1. Field of the Invention

The present invention is related to a fabricating method of a metal-insulator-metal (MIM) capacitor, and more particularly to a MIM capacitor with increased capacitance.

2. Description of the Prior Art

Capacitors are elements that are used extensively in semiconductor devices for storing an electrical charge. Capacitors essentially include two conductive plates separated by an insulator. The capacitance, or amount of charge held by the capacitor per applied voltage, depends on a number of parameters such as the area of the plates, the distance between the plates, and the dielectric constant value of the insulator between the plates. Capacitors are used in filters, analog-to-digital converters, memory devices, control applications, and many other types of semiconductor devices.

One type of capacitor is a metal-insulator-metal (MIM) capacitor, which is frequently used in mixed signal devices and logic semiconductor devices. MIM capacitors are used to store charge in a variety of semiconductor devices.

SUMMARY OF THE INVENTION

It is a primary objective of the present invention to improve the capacitance density in a MIM capacitor.

An aspect of the disclosure provides a method of fabricating a metal-insulator-metal capacitor including providing a dielectric layer. Then, a capacitor trench is formed within the dielectric layer, wherein the method of forming the capacitor trench includes the step of etching the dielectric layer to form a first hole comprising a first convex profile bulging into the dielectric layer. Subsequently, the dielectric layer is etched to form a second hole comprising a second convex profile bulging into the dielectric layer, wherein the second hole connects to the first hole. After the capacitor trench is formed, a first metal layer is formed to conformally cover the capacitor trench. Later, an insulating layer is formed to cover the first metal layer. Finally, a second metal layer is formed covering the insulating layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
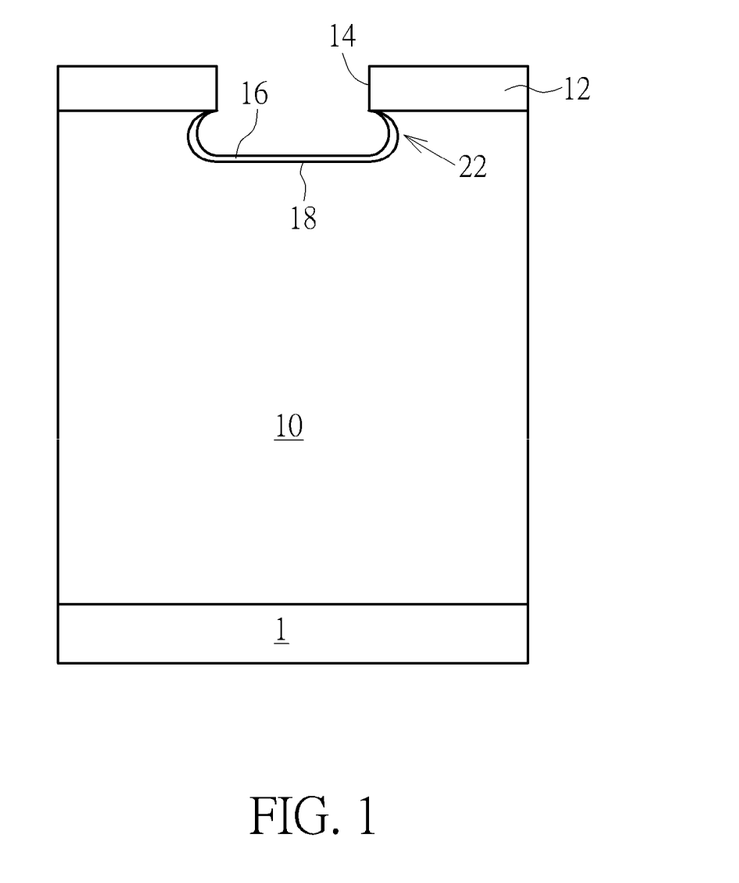
FIG. 1, FIG. 2A, and FIG. 4A show a method of fabricating a capacitor trench according to a first preferred embodiment of the present invention.
Figure 2A:
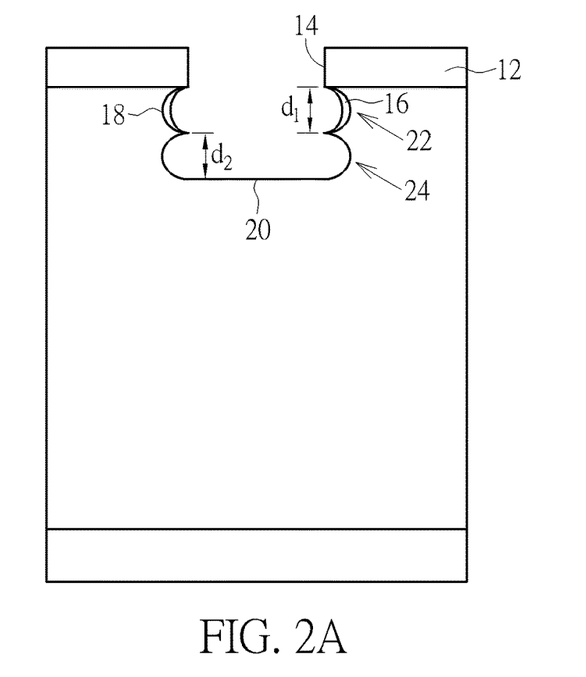
Figure 4A:
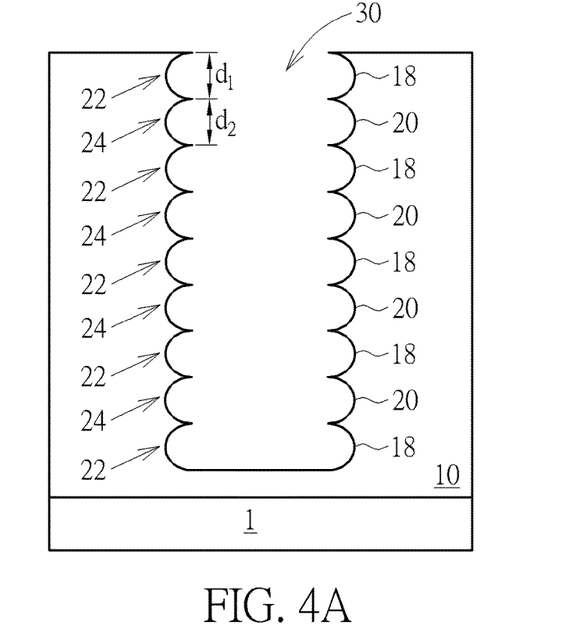

FIG. 1, FIG. 2A, and FIG. 4A show a method of fabricating a capacitor trench according to a first preferred embodiment of the present invention. As shown in FIG. 1 and FIG. 2A, a substrate 1 is provided. The substrate 1 may be a bulk silicon substrate, a germanium substrate, a gallium arsenide substrate, a silicon germanium substrate, an indium phosphide substrate, a gallium nitride substrate or a silicon carbide substrate.

A dielectric layer 10 is formed on the substrate 1. The dielectric layer 10 may be un-doped silicon oxide, doped silicon oxide, silicon nitride, silicon oxynitride, silicon carbon oxynitride, silicon carbon nitride, etc. The substrate 1 may also have some other known structures formed therein, which will not be specified herein. Later, a photolithographic and etching process is applied to the dielectric layer 10 to form at least one capacitor trench within the dielectric layer 10. Specifically, the method of forming the capacitor trench includes steps of coating a mask layer 12 over the dielectric layer 1 followed by patterning the mask layer 12 to form an opening 14. Once the mask layer 12 is patterned, alternating processes of etching and forming a protective liner 16 are repeated to form numerous holes such as a first hole 18 and a second hole 20 within the dielectric layer 10. The dielectric layer 10 is a single layer consisting of a single type material.

In detail, the process of etching is preferably an isotropic dry etch process, such as a Bosch process. As a result of using an isotropic etch process, a first hole 18 (shown in FIG. 1) that extends laterally as well as vertically is formed, thereby creating a first convex profile 22 bulging into the dielectric layer 10. A Bosch process involves introducing a first gas that etches the dielectric layer 10 to a desired depth to form the first hole 18. After the first hole 18 is formed, the first gas is stopped and a second gas is introduced that creates the protective liner 16 along an inner sidewall and a bottom of the first hole 18.

Figure 2B:
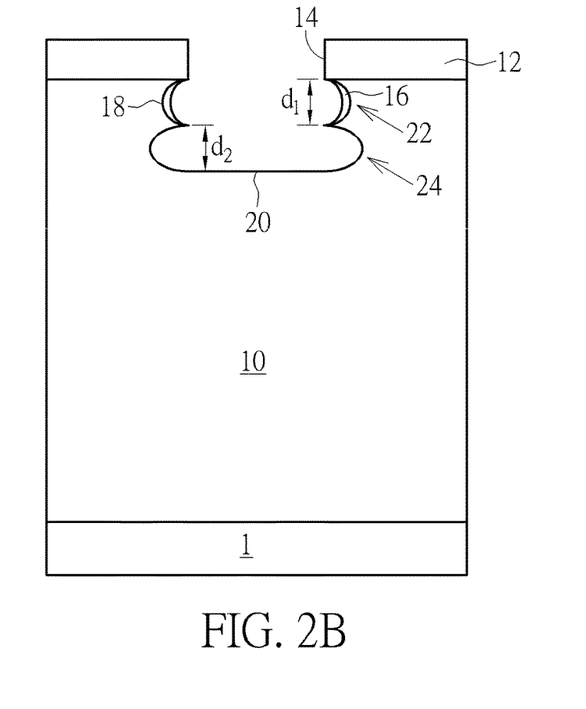
FIG. 2B shows a modified method of fabricating a capacitor trench according to the first preferred embodiment of the present invention.

Refer to FIG. 2A. Later, the first gas is introduced again. The first gas removes the protective liner 16 along the bottom of the first hole 18 and continues etching the dielectric layer 10 along the bottom of the first hole 18 to form the second hole 20. The second hole 20 includes a second convex profile 24 bulging into the dielectric layer 10. The first hole 18 connects to the second hole 20. The process of introducing the first gas and the second gas can be repeated until the desired depth of the capacitor trench is achieved. A first curvature and a first thickness $d_1$ of the first convex profile 22 can be adjusted by controlling the flow rate of the first gas, the operating time of the dry etch process and the operating pressure of the dry etch process. Similarly, a second curvature and a second thickness $d_2$ of the second convex profile 24 can be adjusted by controlling the flow rate of the first gas, the operating time of the dry etch process and the operating pressure of the dry etch process. This means the first curvature and the second curvature can be the same or different. The first thickness $d_1$ and the second thickness $d_2$ can also be the same or different. In FIG. 2A, the first curvature and the second curvature are the same, and the first thickness $d_1$ and the second thickness $d_2$ are also the same. In the example shown in FIG. 2B, the second curvature is greater than the first curvature, while the first thickness $d_1$ and the second thickness $d_2$ are the same.

According to the preferred embodiment of the present invention, the first gas may be $SF_6$. The protective liner may be a polymer, and the second gas may be $C_4F_8$.

Figure 3:
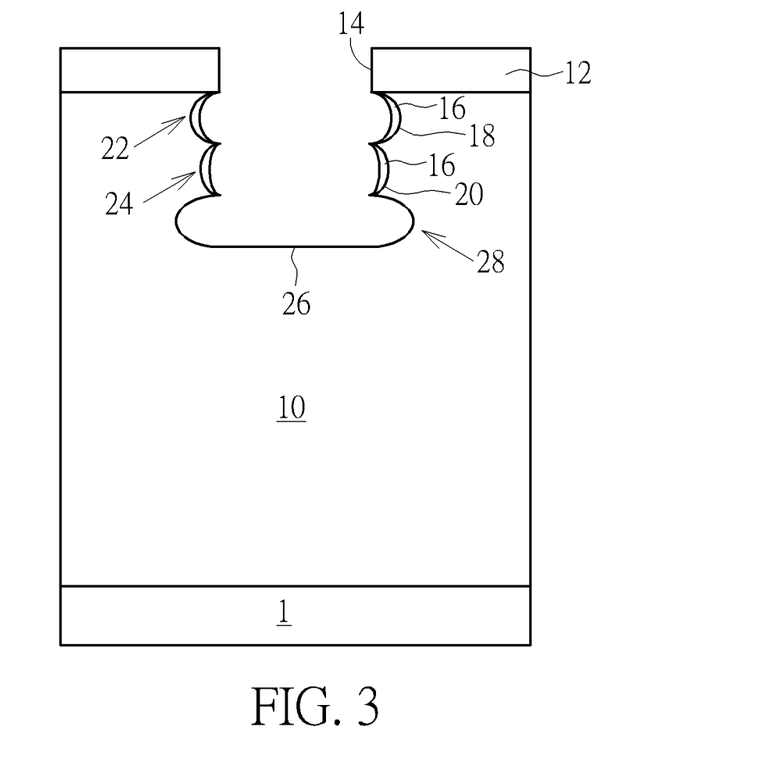
FIG. 3 shows another modified method of fabricating a capacitor trench according to the first preferred embodiment of the present invention.

After the first hole 18 and the second hole 20 are formed, the process described above may be repeated any number of times to create a capacitor trench of the desired depth. After the capacitor trench is completed, the protective liner 16 and the mask layer 12 are entirely removed. In details, after the second hole 20 is formed, the process of introducing the first gas can be repeated to form the first hole 18 again. In a modification, the process of introducing the first gas can be repeated to form the second hole 20 again. In another example, as shown in FIG. 3, the process of introducing the first gas can be repeated to form a third hole 26 having a third convex profile 28 with a third curvature 28 different from the second curvature 24 and the first curvature 22.

FIG. 4A shows a capacitor trench 30 formed by repeatedly and alternately forming the first hole 18 and the second hole 20. The first hole 18 and the second hole 20 are of the same size and the same shape, which means they are formed by using the same etching parameter. The first curvature 22 and the second curvature 24 are therefore the same and the first thickness $d_1$ and the second thickness $d_2$ are also the same.

Figure 4B:
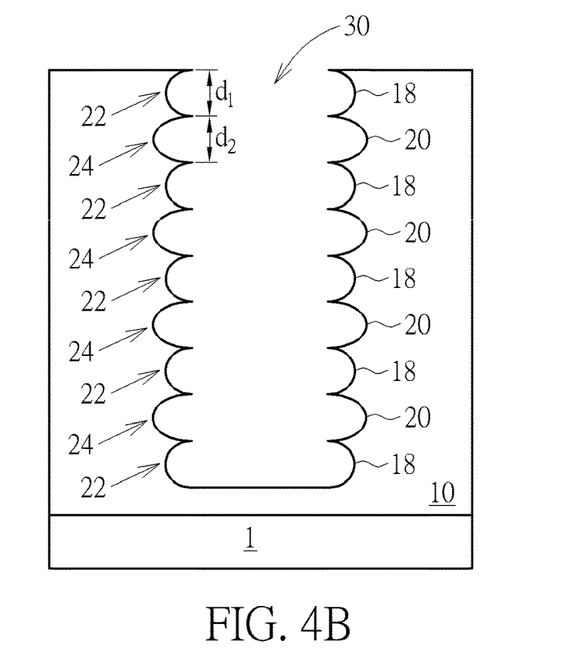
FIG. 4B shows a capacitor trench fabricated by the first preferred embodiment of the present invention.

FIG. 4B shows a modified capacitor trench formed by repeatedly and alternately forming the first hole and the second hole. The first hole 18 and the second hole 20 are of different sizes and different shapes, which means the first hole 18 and the second hole 20 are formed by using different etching parameters, resulting in the first curvature 22 being smaller than the second curvature 24.

Figure 5:
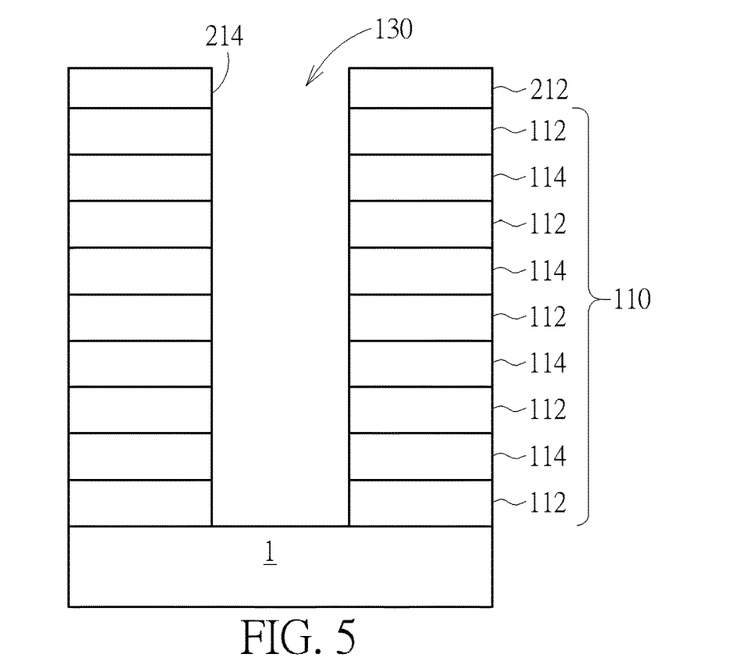
FIG. 5 to FIG. 6 show a method of fabricating the capacitor trench shown in FIG. 4B according to a second preferred embodiment of the present invention.
Figure 6:
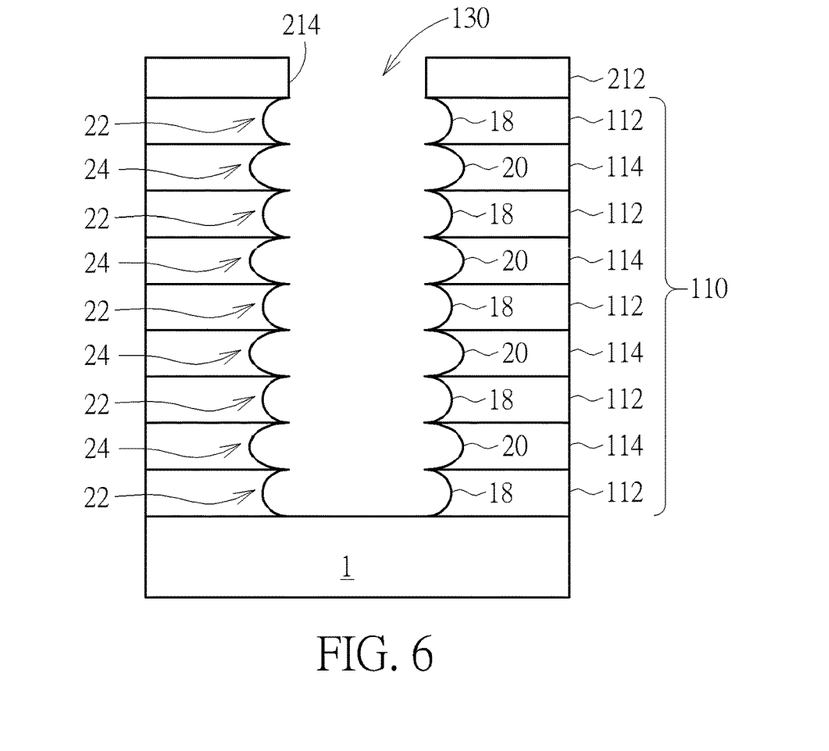

FIG. 5 to FIG. 6 show another method of forming the capacitor trench shown in FIG. 4B according to a second preferred embodiment of the present invention, wherein like reference numerals are used to refer to like elements throughout.

As shown in FIG. 5, a substrate 1 is provided. A stacked dielectric layer 110 is formed on the substrate 1. The stacked dielectric layer 110 may include different types of dielectric layer such as a first dielectric layer 112 and a second dielectric layer 114. The first dielectric layer 112 and the second dielectric layer 114 are disposed alternately. An etching rate of the first dielectric layer 112 and an etching rate of the second dielectric layer 114 are different with respect to the same etchant. The first dielectric layer 112 and the second dielectric layer 114 may be different material. The first dielectric layer 112 and the second dielectric layer 114 can be independently selected from the group including un-doped silicon oxide, doped silicon oxide, silicon nitride, silicon oxynitride, silicon carbon oxynitride, silicon carbon nitride, etc.

In another embodiment, the first dielectric layer 112 and the second dielectric layer 114 may include the same material. Preferably, the first dielectric layer 112 and the second dielectric layer 114 are the same chemical compound. The material can be selected from the group including un-doped silicon oxide, silicon nitride, silicon oxynitride, silicon carbon oxynitride, silicon carbon nitride, etc. However, the first dielectric layer 112 and the second dielectric layer 114 may have different dopant concentration therein. For example, the first dielectric layer 112 includes dopants of a first concentration and the second dielectric layer 114 includes dopants of a second concentration. The first concentration is different from the second concentration. In another embodiment, the first concentration is zero. The second concentration has a gradient decreasing from the middle of the second dielectric layer 114 to the top of the second dielectric layer 114. The gradient of the second concentration also decreases from the middle of the second dielectric layer 114 to the bottom of the second dielectric layer 114. The dopant may be boron or phosphorous.

According yet another embodiment, the first dielectric layer 112 and the second dielectric layer 114 may include the same material. Preferably, the first dielectric layer 112 and the second dielectric layer 114 are the same chemical compound. The material can be selected from the group including un-doped silicon oxide, silicon nitride, silicon oxynitride, silicon carbon oxynitride, silicon carbon nitride, etc. The first dielectric layer 112 is formed under numerous first fabricating parameters during first fabricating steps. The second dielectric layer 114 is formed under numerous second fabricating parameters during second fabricating steps. At least one of the first fabricating parameters is different from at least one of the second fabricating parameters. The first fabricating parameters and the second fabricating parameters can be independently selected from the group including fabricating pressure, fabricating power, fabricating time or precursors. For example, the first dielectric layer 112 and the second dielectric layer 114 are both silicon oxide. The first dielectric layer 112 is fabricated at a fabricating pressure different from that of the second dielectric layer 114.

Referring to FIG. 5 still, a trench 130 is formed by etching the first dielectric layer 112 and the second dielectric layer 114. As shown in FIG. 6, after forming the trench 130, the first dielectric layer 112 and the second dielectric layer 114 are etched simultaneously at different etching rates by using the same etchant to form the first hole 18 and the second hole 20. The first hole 18 is only within the first dielectric layer 112, and the second hole 20 is only within the second dielectric layer 114. It is noteworthy that an etching rate of the second dielectric layer 114 and the first dielectric layer 112 are different with respect to the same etchant. Because the first dielectric layer 112 and the second dielectric layer 114 are etched by the same etchant simultaneously and at the same duration, the first hole 18 formed in the first dielectric layer 112 and the second hole 20 formed in the second dielectric layer 114 are different in size. In detail, the first curvature 22 of the first hole 18 is different from the second curvature 24 of the second hole 20.

According to the second preferred embodiment, the first dielectric layer 112 may be un-doped silicon oxide, and the second dielectric layer 114 may be doped silicon oxide. A deep UV type photoresist layer 212 is deposited and patterned on top to show an opening 214. The photoresist layer 212 is patterned by being exposed to UV radiation and then developed by a caustic-type developing solution.

During the exposure, the photoresist layer 212 is partially degraded to form a polymeric based passivation layer (not shown) on the surface of the first dielectric layer 112 and the second dielectric layer 114. After the dielectric layer 110 is subjected to a high density plasma etching process, an acidic reaction product (not shown) generated by the photoresist layer 212 when exposed to the UV emission and then the acidic reaction product reacts with the first dielectric layer 112 and the second dielectric layer 114 in different reacting rates. Therefore, holes having different curvatures are respectively formed in the first dielectric layer 112 and the second dielectric layer 114. At this point, a capacitor trench 30 is completed.

The stacked dielectric layer 110 is not limited to only include two different dielectric layers. There can be more types of dielectric layers in the stacked dielectric layer 110. In this way, the size of the holes in each dielectric layer will be different. Furthermore, the holes are all connected. As a result, the sidewall of the capacitor trench 30 consists of numerous convex profiles with different curvatures. The entire capacitor trench 30 will be defined by several different dielectric layers with different etching rates with respect to the same etchant.

Figure 7:
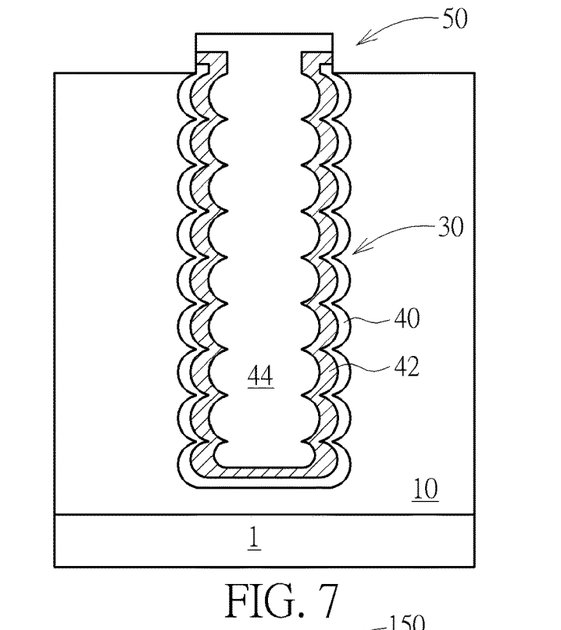
FIG. 7 is a fabricating stage following FIG. 4A.

FIG. 7 is a fabricating stage following FIG. 4A. As shown in FIG. 7, a first metal layer 40 is formed to conformally cover the capacitor trench 30. Later, an insulating layer 42 is formed on the first metal layer 40. Subsequently, a second metal layer 44 is formed on the insulating layer 42. At this point, a MIM capacitor 50 is completed. The first metal layer 40 serves as the first plate of the MIM capacitor 50 and the second metal layer 44 serves as the second plate of the MIM capacitor 50. Materials that may be considered for the creation of the first metal layer and second metal layer of an MIM capacitor 50 are tantalum, tantalum nitride, titanium, titanium nitride, tantalum oxide or silicon nitride, whereas materials that can be used as the insulating layer 42 are oxide-nitride-oxide, aluminum oxide, tantalum oxide, hafnium oxide, silicon dioxide, $BaSrTiO_3$, or $SrTiO_3$.

Although only the capacitor trench 30 in FIG. 4A is given as an example of forming the MIM capacitor 50, the method of fabricating the first metal layer, the second metal layer, and the insulating layer illustrated above can also be applied to the capacitor trenches 30 in FIG. 4B and FIG. 6.

Figure 8:
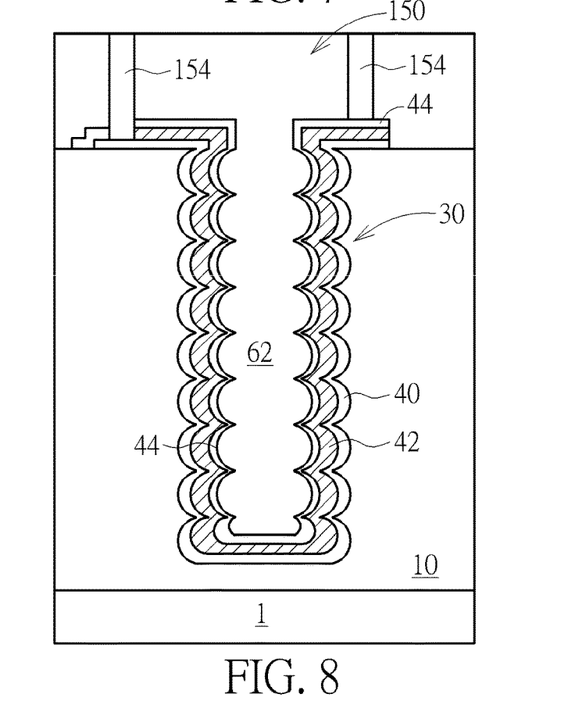
FIG. 8 is a modified fabricating method of a MIM capacitor.

FIG. 8 is a modified fabricating method of a MIM capacitor, wherein like reference numerals are used to refer to like elements throughout. As shown in FIG. 8, the first metal layer 40, the insulating layer 42 and the second metal layer 44 are formed in sequence to comprise a MIM capacitor 150. The difference between the second metal layer 44 in FIG. 7 and FIG. 8 is that the second metal layer 44 in FIG. 8 is formed conformally to cover the insulating layer 42, resulting in a hole being left in between the second metal layer 44. A dielectric layer 62 is formed to fill in the hole, i.e. a dielectric layer 62 is formed in the capacitor trench 30. Furthermore, the dielectric layer 62 also covers the MIM capacitor 150 to serve as an interlayer dielectric.

Figure 9:
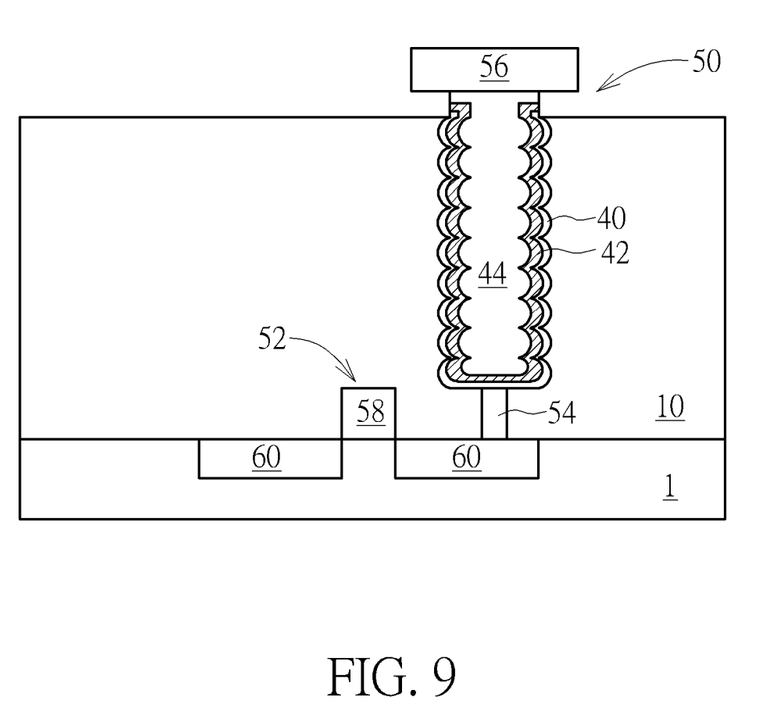
FIG. 9 is a fabricating stage following FIG. 7.

As shown in FIG. 9, for some applications (DRAM applications for example), the first metal layer 40 of the MIM capacitor 50 can electrically connect to a MOS transistor 52 through a conductive via 54 that penetrates the dielectric layer 10. The second metal layer 44 may electrically connect to a conductive terminal 56 on the top of the MIM capacitor 50. The terminal 56 helps the MIM capacitor 50 to connect to the outside signal. The MOS transistor 52 includes a gate electrode 58 and two source/drain doped regions 60. In other way, as shown in FIG. 8, the MIM capacitor 150 can also use two conductive vias 154 disposed on the MIM capacitor 150 to connect with outside signals. The conductive vias 154 penetrate the dielectric layer 62.

The capacitor trench formed by the present invention has numerous convex profiles on the sidewall of the capacitor trench. The curvatures of each convex profile can be the same or different. The first metal layer, the insulating layer and the second metal layer extend into convex profiles, and accordingly have more surface area than they would in the absence of the convex profiles. The additional surface area can be beneficial because it increases the capacitance of the MIM capacitor relative to the capacitance of the MIM capacitors formed in the absence of convex profiles.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a metal-insulator-metal (MIM) capacitor, comprising:
   providing a dielectric layer, wherein the dielectric layer comprises un-doped silicon oxide, doped silicon oxide, silicon nitride, silicon oxynitride, silicon carbon oxynitride or silicon carbon nitride, and wherein the dielectric layer comprises a first dielectric layer and a second dielectric layer, and an etching rate of the first dielectric layer and an etching rate of the second dielectric layer are different with respect to a same etchant;
   forming a capacitor trench within the dielectric layer, wherein the method of forming the capacitor trench comprises the steps of:
      etching the dielectric layer to form a first hole comprising a first convex profile bulging into the dielectric layer; and
      etching the dielectric layer to form a second hole comprising a second convex profile bulging into the dielectric layer, wherein the second hole connects to the first hole, the first convex profile comprises a first curvature, the second convex profile comprises a second curvature, and the first curvature is different from the second curvature, the first hole is within the first dielectric layer and the second hole is within the second dielectric layer;
   forming a first metal layer conformally covering the capacitor trench;
   forming an insulating layer covering the first metal layer; and
   forming a second metal layer covering the insulating layer.

2. The method of fabricating a MIM capacitor of claim 1, wherein the method of forming the capacitor trench further comprises repeating the step of forming the first hole.

3. The method of fabricating a MIM capacitor of claim 1, wherein the method of forming the capacitor trench further comprising repeating the step of forming the second hole.

4. The method of fabricating a MIM capacitor of claim 1, wherein the first convex profile comprises a first curvature, the second convex profile comprises a second curvature, and the first curvature is the same as the second curvature.

5. The method of fabricating a MIM capacitor of claim 4, wherein the dielectric layer is a single layer consisting of a single type of material.

6. The method of fabricating a MIM capacitor of claim 1, wherein the first dielectric layer comprises dopants of a first concentration, the second dielectric layer comprises dopants of a second concentration, the first dielectric layer and the second dielectric layer comprise the same material.

7. The method of fabricating a MIM capacitor of claim 6, wherein the first concentration is zero, the second concentration has a gradient decreasing from the middle of the second dielectric layer to the top of the second dielectric layer.

8. The method of fabricating a MIM capacitor of claim 6, wherein the first concentration and the second concentration are different.

9. The method of fabricating a MIM capacitor of claim 1, wherein first dielectric layer and the second dielectric layer comprises the same material, the first dielectric layer is formed by a plurality of first fabricating parameters, the second dielectric layer is formed by a plurality of second fabricating parameters, at least one of the first fabricating parameters is different from at least one of the second fabricating parameters.

10. The method of fabricating a MIM capacitor of claim 1, wherein steps of forming the first hole and the second hole comprise:
   etching the first dielectric layer and the second dielectric layer to form a trench; and
   after forming the trench, etching the first dielectric layer and the second dielectric layer simultaneously at different etching rates to form the first hole and the second hole.

11. The method of fabricating a MIM capacitor of claim 1, wherein the second hole is below the first hole.

12. The method of fabricating a MIM capacitor of claim 1, wherein steps of forming the first hole and the second hole comprise:
   performing an isotropic etching process on the dielectric layer to form the first hole;
   forming a liner covering an inner wall of the first hole;
   after forming the first hole, performing the isotropic etching process to the bottom of the first hole and etching the dielectric layer to form the second hole; and
   removing the liner after forming the second hole.

* * * * *